United States Patent
Shim et al.

(10) Patent No.: US 7,858,025 B2
(45) Date of Patent: Dec. 28, 2010

(54) METHOD FOR MANUFACTURING CUBIC COPPER OR COPPER OXIDE NANOPARTICLES

(75) Inventors: In-Keun Shim, Seoul (KR); Young-Soo Oh, Seongnam-si (KR); Jae-Woo Joung, Suwon-si (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 515 days.

(21) Appl. No.: 11/844,558

(22) Filed: Aug. 24, 2007

(65) Prior Publication Data

US 2008/0159902 A1    Jul. 3, 2008

(30) Foreign Application Priority Data

Aug. 29, 2006    (KR) .................. 10-2006-0082096

(51) Int. Cl.
    *C22C 9/00*    (2006.01)
    *B22F 9/16*    (2006.01)

(52) U.S. Cl. .......................... 420/469; 75/373

(58) Field of Classification Search .................. None
See application file for complete search history.

(56) References Cited

U.S. PATENT DOCUMENTS 6,929,675 B1 *   8/2005   Bunge et al. .................. 75/362

FOREIGN PATENT DOCUMENTS

| JP | 58-224103 | 12/1983 |
|----|-----------|---------|
| JP | 02-294415 | 12/1990 |

OTHER PUBLICATIONS

Japanese Office Action, with partial English translation, issued in Japanese Patent Application No. 2007-221402, mailed Sep. 14, 2010.

* cited by examiner

*Primary Examiner*—George Wyszomierski
*Assistant Examiner*—Yoshitoshi Takeuchi
(74) *Attorney, Agent, or Firm*—McDermott Will & Emery LLP

(57) ABSTRACT

The present invention relates to a method of manufacturing cubic copper nanoparticles, and in particular, to a method including (a) mixing and agitating a copper precursor and an amine compound; (b) raising the temperature of the mixed solution up to 90-170° C. and reacting it at the same temperature; (c) adding the mixture to nonaqueous solvent to lower the temperature of the solution to 20-50° C. when the incubation completes; and (d) precipitating and obtaining the nanoparticles by adding an alcohol solvent to the mixture. According to the invention, while conductive wiring is formed metal nanoparticles can be manufactured not in sphere but in cubic shape so that void between particles can be efficiently removed and the height of wiring can be raised.

17 Claims, 7 Drawing Sheets

CURING

CURING

CURING

METHOD FOR MANUFACTURING CUBIC COPPER OR COPPER OXIDE NANOPARTICLES

CROSS-REFERENCE TO RELATED APPLICATIONS

This application claims the benefit of Korean Patent Application No. 10-2006-0082096 filed on Aug. 29, 2006, with the Korea Intellectual Property Office, the contents of which are incorporated here by reference in their entirety.

BACKGROUND

1. Technical Field

The present invention relates to a method for manufacturing cubic copper nanoparticles, and in particular, a method for manufacturing nanoparticles in cubic shape using inkjet, which reduces the void of a wiring pattern in forming a conductive wiring pattern and raises the height of a wiring pattern.

2. Description of the Related Art

As the applications of nanotechnology are realized, the efforts to make and modify nano structures in various aspects are rapidly increasing. The major field of nano science, nanoparticles, have been studied in depth due to their superior catalytic property. Recently, there are many trials to apply them to the printed electronics using printing technology. The reason that such nanoparticles are used in the printed electronics is to further reduce the width of wirings used in electronic parts. That is, spraying bulk metal particles by paste method or plating is difficult to provide slim wiring. Therefore, conductive metal nanoparticles having conductivity are used to provide ultra slim wiring.

The existing copper nanoparticles are in a sphere shape. However, when these sphere metal nanoparticles are used to manufacture a conductive nano ink and then ejected the ink via inkjet to form a conductive wiring, it can cause problems that it forms void between the spheres no matter how closely the particles are packed, and there is a limitation in increasing the height of wiring. These problems are lead to deterioration of conductivity in the conductive wiring.

Therefore, there is a demand for research on a new method for preventing the formation of void of a conductive wiring and increasing the height of a wiring.

SUMMARY

The present invention is to address the existing problems set forth above, and thus the invention is to manufacture metal nanoparticles not in sphere but in cubic shape and to provide a method for manufacturing cubic copper nanoparticles that can effectively eliminate void when manufacturing a conductive wiring and increase the height of a wiring.

The invention provides a method for manufacturing cubic copper nanoparticles, including:

mixing and agitating a copper precursor and an amine compound;

raising the temperature of the mixed solution up to 90-170° C. and reacting it at the same temperature;

adding the mixed solution to a non-aqueous solvent to lower the temperature of the mixed solution to 20-50° C. when the reaction is completed; and precipitating and obtaining nanoparticles by adding an alcohol solvent to the mixture.

Here, the copper precursor is one or more compounds selected from the group consisting of copper(II) chloride, copper(II) nitrate, copper(II) sulfate, copper(II) acetate, copper(II) acetylacetonate, copper(II) carbonate, copper(II) cyclohexane butyrate, copper(II) stearate, copper(II) perchlorate, copper(II) ethylenediamine and copper(II) hydroxide.

According to an embodiment of the invention, the amine compound is a primary amine of C3-C20. Specifically, the amine compound is one or more compounds selected from the group consisting of oleylamine, decylamine, isodecylamine, dodecylamine, tetradecylamine, octadecylamine and butylamine. The content of the amine compound is 650-850 parts by weight with respect to 100 parts by weight of the copper precursor.

According to an embodiment of the invention, the temperature of the mixed solution is raised in a uniform rate. Here, the rate may be 1-10° C./minute. Further, the reaction is conducted for 1-30 minutes.

According to an aspect of the invention, the step of raising the temperature of the mixed solution may further include adding a reducing agent to the mixed solution before raising the temperature of the mixed solution. The reducing agent is one or more compounds selected from the group consisting of sodium hydroxide, potassium hydroxide, hydrazine, sodium hydrophosphate, glucose, ascorbic acid, tannic acid, dimethyl formamide, tetrabutyl ammonium borohydride, sodium borohydride, lithium borohydride and formic acid. The content of the reducing agent is 0.001-30 parts by weight with respect to 100 parts by weight of the mixed solution.

The non-aqueous solvent is one or more compounds selected from the group consisting of benzene, fluorobenzene, toluene, trifluorotoluene, xylene, hexane, cyclohexane, heptane, octane, isooctane, decane, tetradecane, 1-octadecene, 1-hexadecene and tetrahydrofuran. The non-aqueous solvent can be used after chilled, and the amount that can lower the temperature of the mixed solution to 20-50° C. is used.

The alcohol solvent is one or more compounds selected from the group consisting of methanol, ethanol, propanol, and isopropanol. More preferably, methanol or a mixed solution of methanol and ethanol can be used.

The obtaining of the precipitated nanoparticles can be performed by isolating nanoparticles from the mixed solution by centrifugation. The obtaining of the precipitated nanoparticles may further include washing the nanoparticles with an alcohol solvent and drying.

The copper nanoparticles thus obtained are in a metal state or in a metal oxide state.

BRIEF DESCRIPTION OF THE DRAWINGS

These and/or other aspects and advantages of the present invention will become apparent and more readily appreciated from the following description of the embodiments, taken in conjunction with the accompanying drawings of which.

DETAILED DESCRIPTION

Hereinafter, the method for manufacturing cubic copper nanoparticles will be described in detail.

Figure 1:
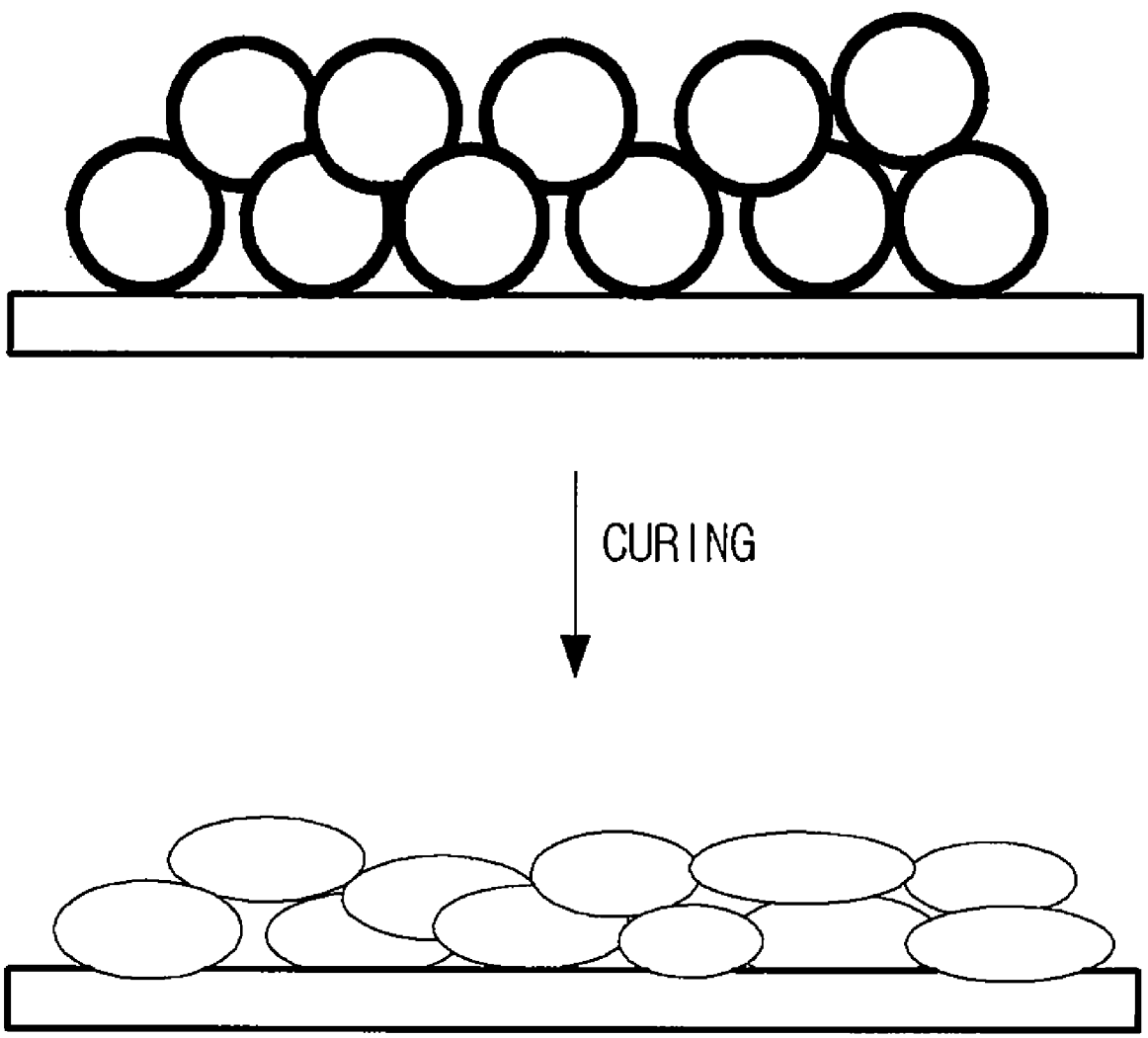
FIG. 1 is a schematic drawing of forming a conductive wiring with existing sphere metal nanoparticles.
Figure 2:
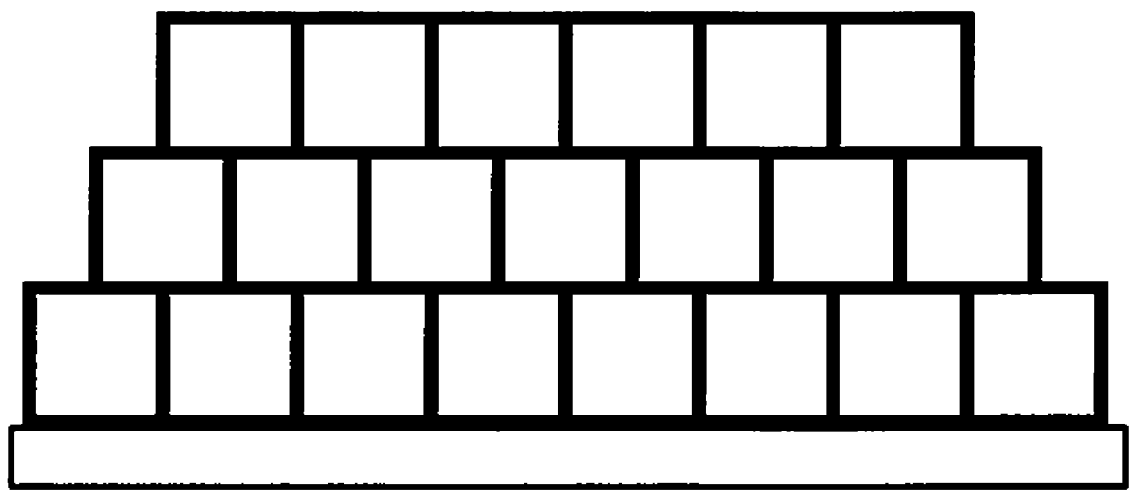
FIG. 2 is a schematic drawing of forming a conductive wiring with cubic copper metal nanoparticles according to the invention.
Figure 2:
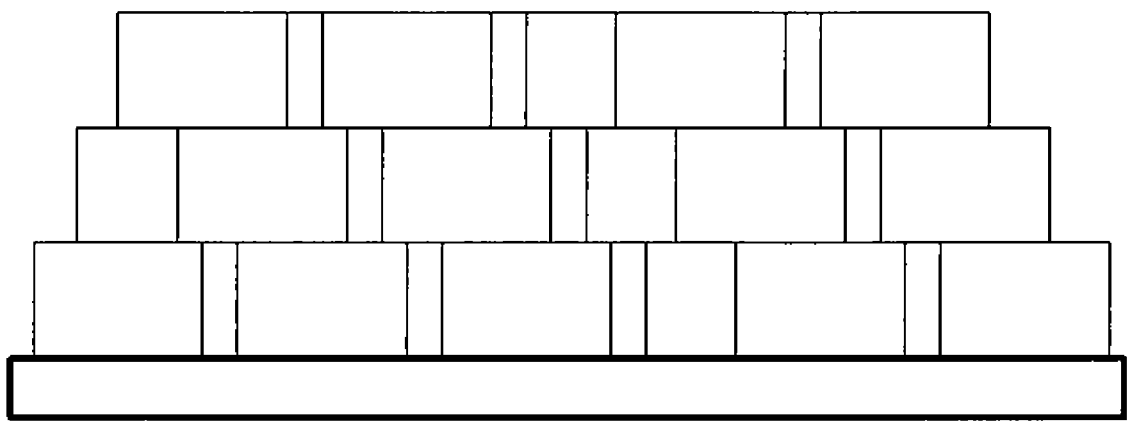

If ink jet printing and curing is performed with existing sphere copper nanoparticles, as shown in FIG. 1, necking between nanoparticles occurs and leads to packing which causes the formation of void between particles no matter how close the particles are packed. On the other hand, because copper nanoparticles manufactured by the present invention have a cubic shape, in the case of these particles are manufactured as a conductive ink and printed by inkjet, as shown in FIG. 2, the particles are packed closely together after curing and thus there is not only no void but also efficient raise in the height of a conductive wiring.

Figure 3:
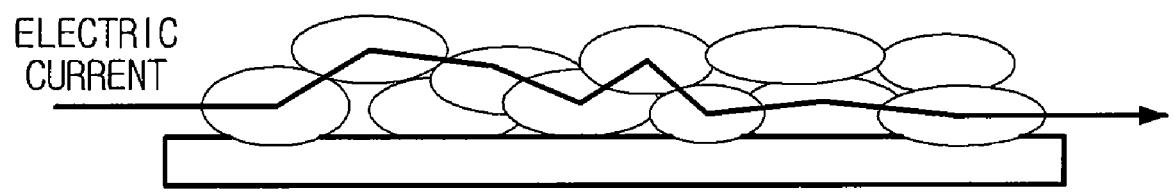
FIG. 3 is an electric current flow of a conductive wiring formed with existing sphere metal nanoparticles.

These results may influence the conductivity of a conductive wiring. As shown in FIG. 3, in the case of the conductive wiring formed with existing sphere copper nanoparticles, an electric current flow is hindered by void, which increases the electric resistance and deteriorates the conductivity.

Figure 4:
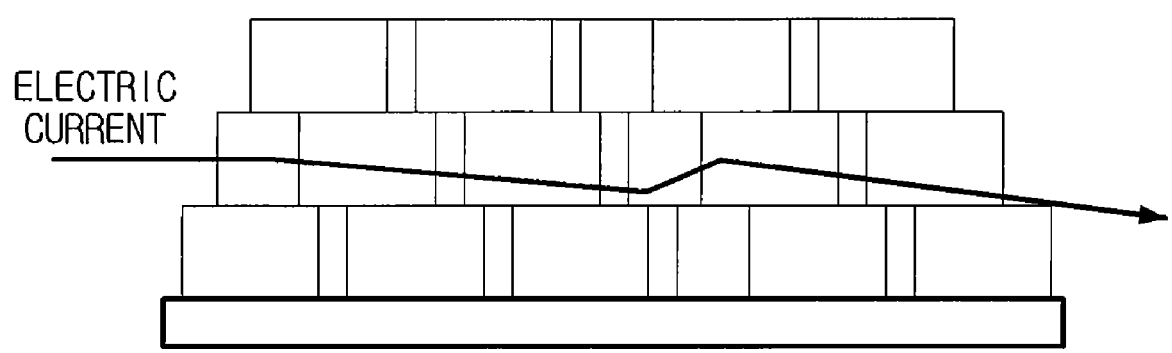
FIG. 4 is an electric current flow of a conductive wiring formed with cubic copper nanoparticles according to the invention.

Contrarily, as shown in FIG. 4, in the case of the conductive wiring formed by cubic copper nanoparticles manufactured by the invention, an electric current flow is smooth that improves the conductivity.

The present invention relates to a method for manufacturing cubic copper nanoparticles which is effective to improve the conductivity and raise the height of a wiring by eliminating void of a wiring.

The method for manufacturing cubic copper nanoparticles according to the present invention includes mixing and agitating a copper precursor and an amine compound;

raising the temperature of the mixed solution to 90-170° C. and reacting it at the same temperature;

adding the mixed solution to a non-aqueous solvent to lower the temperature to 20-50° C. if the reacting is completed; and adding an alcohol based solvent to the mixed solution and precipitating and obtaining nanoparticles.

The method according to the invention is first mixing and agitating a copper precursor and an amine compound.

The copper precursor may be one or more water soluble salts of copper selected from the group consisting of copper (II) chloride, copper(II) nitrate, copper(II) sulfate, copper(II) acetate, copper(II) acetylacetonate, copper(II) carbonate, copper(II) cyclohexane butyrate, copper(II) stearate, copper (II) perchlorate, copper(II) ethylenediamine and copper(II) hydroxide, but not limited to these.

Further, any primary amine compound may be used as the amine compound, such as primary amine compounds of C3-C20. Specifically, the amine compound is one or more compounds selected from the group consisting of oleylamine, decylamine, isodecylamine, dodecylamine, tetradecylamine, octadecylamine and butylamine, but not limited to these. The amine compound is a reductive nonaqueous solvent that dissolves copper precursors and reduces them to generate nanoparticles.

Considering solubility and adhesiveness with copper, the copper precursor and the amine compound are selected.

The content of the amine compound is 650-850 parts by weight with respect to 100 parts by weight of the copper precursor. If the content of the amine compound is lower than 650 parts by weight, the size of particles increases which further deteriorates dispersibility, and if the content of the amine compound exceeds 850 parts by weight, it increases the manufacturing cost and the nanoparticles may be in a sphere shape rather than in a cubic shape.

The mixture of the copper precursor and the amine compound is agitated until the solute is thoroughly dissolved. The agitating temperature is 80-100° C. and the solutes are easily dissolves at this temperature.

The mixed solution is prepared by agitating, it is heated to 90-170° C. and reacted for a certain period of time at the same temperature.

According to an embodiment, the temperature is raised with a uniform rate, the heating rate is 1-10° C./minute. If the heating rate is lower than 1° C./minute, nanoparticles grow slowly with the reduction of copper ions so that they may grow in a sphere shape, and if the heating rate exceeds 10° C./minute, the reaction occurs rapidly, so that it may be difficult to control the reaction and be unsafe.

The mixed solution is heated to 90-170° C. with this rate. Such temperature is to reduce the copper precursor properly. If the temperature is lower than 90° C., the reduction of the copper precursor may not occur properly, and if the temperature exceeds 170° C., it may surpass the boiling point of the amine compound. More preferably, the temperature ranges 110-170° C., which does not exceed the boiling point of the amine compound used in the invention.

If the reaction reaches to the temperature set forth above, the mixed solution is reacted for 1-30 minutes. If the reaction time is shorter than 1 minute, copper ions cannot be reduced sufficiently, and if it exceeds 30 minutes, particles overgrow and cubic nanoparticles generated are not uniform. The reaction time may vary with concentration of a precursor and a mole ratio or a weight ratio of the precursor and the amine.

In the invention, the reaction temperature and the reaction time can be appropriately adjusted according to the oxidation state of nanoparticles. That is, to obtain copper nanoparticles having oxidation state of zero (0), the reaction temperature is raised to a higher temperature such as 150-210° C., or a strong reducing agent is used at 50-110° C. Further, to obtain copper nanoparticles of a metal oxide having the oxidation state of one (1), the reaction is performed at a lower temperature of 90-170° C., or an additional reducing agent is used at 50-110° C.

Further, according to an embodiment of the invention, when the mixed solution is reacted, adding a reducing agent to the mixed solution before raising the temperature of the mixed solution can be optionally included to make reduction of copper ions easy.

The reducing agent may be one or more compounds selected from the group consisting of sodium hydroxide, potassium hydroxide, hydrazine, sodium hydrophosphate, glucose, ascorbic acid, tannic acid, dimethyl formamide, tetrabutyl ammonium borohydride, sodium borohydride, lithium borohydride and formic acid, but not limited to these. The content of the reducing agent is 0.001-30 parts by weight with respect to 100 parts by weight of the mixed solution. The content of the reducing agent is determined by considering the oxidation state of copper nanoparticles and reaction temperature and reaction time of the mixed solution. For example, in the case of obtaining copper nanoparticles of the oxidation state of zero, the reaction can be performed at a lower temperature using a reducing agent. In the case of using the reducing agent, if the content of the reducing agent is lower than 0.001 parts by weight, the reducing power is too weak to expect a desired effect, and if the content exceeds 30 parts by weight, the reaction occurs so explosively that control of the reaction becomes difficult.

The copper ions in the mixed solution start to be stained, and the reaction is terminated when the reaction mixture becomes brown or dark-red color, which is the final stage of the reaction.

When the reaction completes, the mixed solution is added to a nonaqueous solvent lower the temperature of the solution. This is to prevent overgrowth of copper nanoparticles by lowering the temperature of the mixed solution. It is preferable that the temperature of the mixed solution be lowered down below 50° C., more preferably, 20-50° C. If the temperature is below 20° C., the amount of the used nonaqueous solvent is too large and it is inefficient, and if the temperature exceeds 50° C., overgrowth of nanoparticles can occur as described previously.

Here, the nonaqueous solvent may be one or more compounds selected from the group consisting of benzene, fluorobenzene, toluene, trifluorotoluene, xylene, hexane, cyclohexane, heptane, octane, isooctane, decane, tetradecane, 1-octadecene, 1-hexadecene and tetrahydrofuran, but not limited to these. The nonaqueous solvent is used in an amount that can lower the temperature of the solution below 50° C., pre-cooled nonaqueous solvent can be used to rapidly cool down the mixed solution.

After the temperature of the mixed solution is lowered down, the alcohol solvent is added to the mixed solution to precipitate nanoparticles.

The alcohol solvent may be one or more compounds selected from the group consisting of methanol, ethanol, propanol and isopropanol, but not limited to these. Preferably, methanol or a mixed solution of methanol and ethanol may be used. The content of the alcohol solvent is 80-300 parts by weight with respect to 100 parts by weight of the total amount of solution of the previous step. By adding such an excess amount of the alcohol solvent, nanoparticles dispersed in the nonaqueous solution move to the polar alcohol solvent and are precipitated out due to difference in solubility.

To obtaining the precipitated nanoparticles, is centrifugation performed to isolate the nanoparticles from the mixed solution. The centrifugation may be performed at 2000-5000 rpm for 1-10 minutes.

The obtaining procedure can further include washing the nanoparticles with an alcohol solvent to remove side reactants and remaining substances and drying. The alcohol solvent used may be the same solvent that are used in precipitating nanoparticles, for example, methanol, or a mixed solution of methanol and ethanol. After repeated washing of nanoparticles with the alcohol solvent, nanoparticles in powder form may be obtained by drying with a vacuum oven, a furnace or a dryer. Here, the drying is performed at 30-60° C. in nitrogen or atmosphere condition.

Such obtained copper nanoparticles may have 5-50 nm of particle size in a cubic shape, and be obtained in metal state or metal oxide state according to the condition of reaction.

Hereinafter, though the invention will be illustrated by examples, the idea of the invention is not limited to them. The examples 1 and 2 are examples of manufacturing cubic copper oxide nanoparticles, and the examples 3 and 4 are examples of manufacturing cubic copper nanoparticles.

Example 1

300 g of oleylamine and 40 g of copper acetoacetate were added to a 4-bulb 1 L flask and agitated at 90° C. for 30 minutes to thoroughly dissolve the solute. Then the temperature was raised to 170° C. by 4° C./minute of rate and the mixture was reacted at 170° C. for 10 minutes. After completion of the reaction, the mixture was poured to 200 g of toluene to lower the temperature, and 500 g of methanol was added here to precipitate copper oxide nanoparticles. The mixture was centrifuged at 400 rpm for 5 minutes to isolate the copper oxide nanoparticles from the solution, and the isolated nanoparticles were washed 3 times with ethanol and dried in a 45° C. vacuum oven to provide nanoparticle powder.

Example 2

Copper oxide nanoparticles were obtained using the same procedure with the example 1 except that dodecyl amine was used as the amine compound.

Example 3

300 g of oleylamine and 40 g of copper acetoacetate were added to a 4-bulb 1 L flask and agitated at 90° C. for 30 minutes to thoroughly dissolve the solute. Then 1 g of sodium borohydride was added and the temperature was raised to 160° C. by 4° C./minute of rate and the mixture was reacted at 170° C. for 10 minutes. After completion of the reaction, the mixture was poured to 200 g of toluene to lower the temperature, and 500 g of methanol was added here to precipitate copper nanoparticles. The mixture was centrifuged at 400 rpm for 5 minutes to isolate copper nanoparticles from the solution, the isolated copper nanoparticles were washed 3 times with ethanol and dried in a 45° C. vacuum oven to provide the copper nanoparticle powder.

Example 4

Copper oxide nanoparticles were obtained using the same procedure with the example 3 except that dodecyl amine was used as the amine compound.

Figure 5:
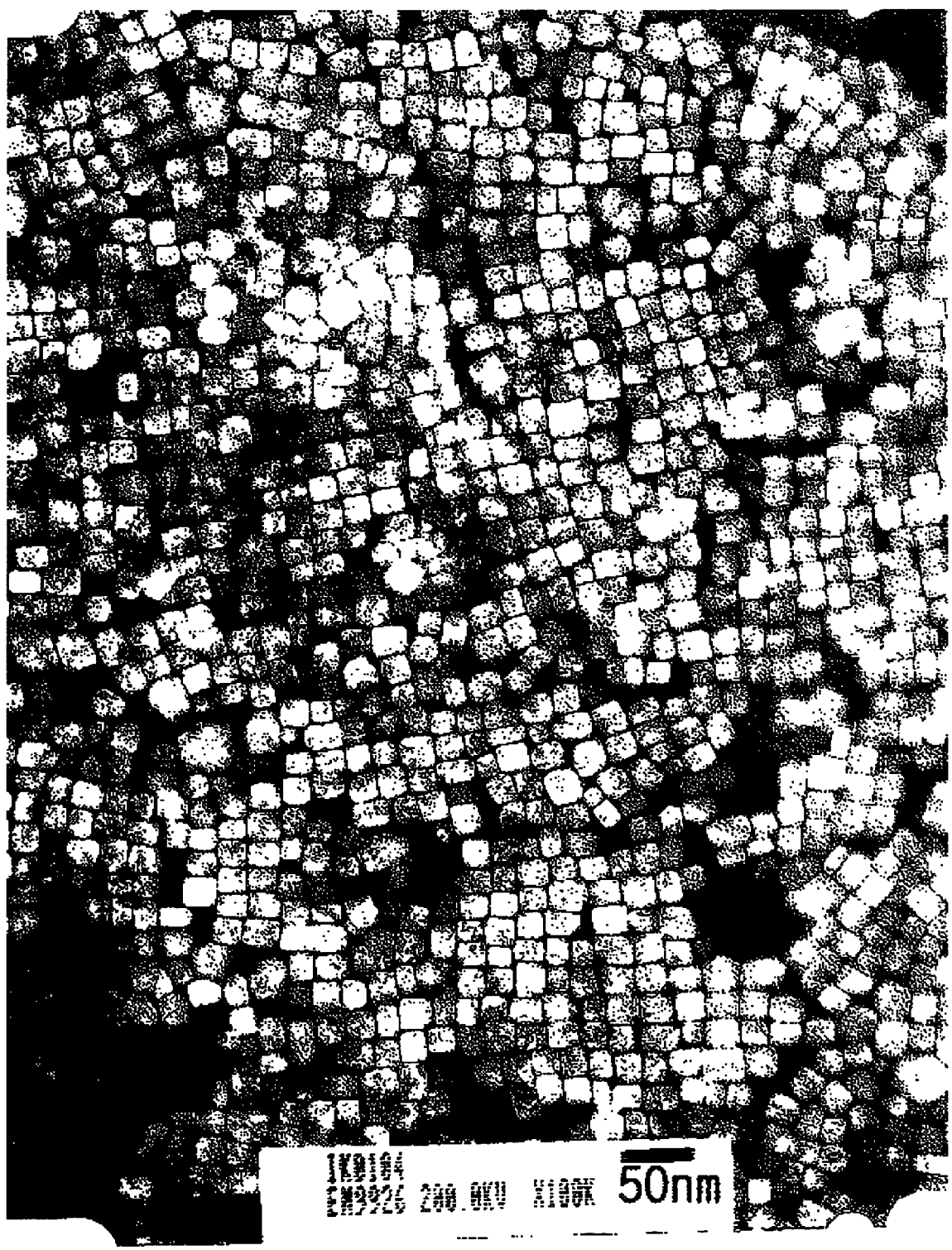
FIG. 5 is a TEM photo of copper oxide nanoparticles manufactured in example 1 of the invention.

FIG. 5 represents a TEM photo of the copper oxide nanoparticles and the copper nanoparticles obtained by example 1. As shown in the TEM photo of FIG. 5, it is certain that the copper oxide nanoparticles according to the invention were manufactured uniformly in a cubic shape having about 15 nm of a particle size.

Figure 6:
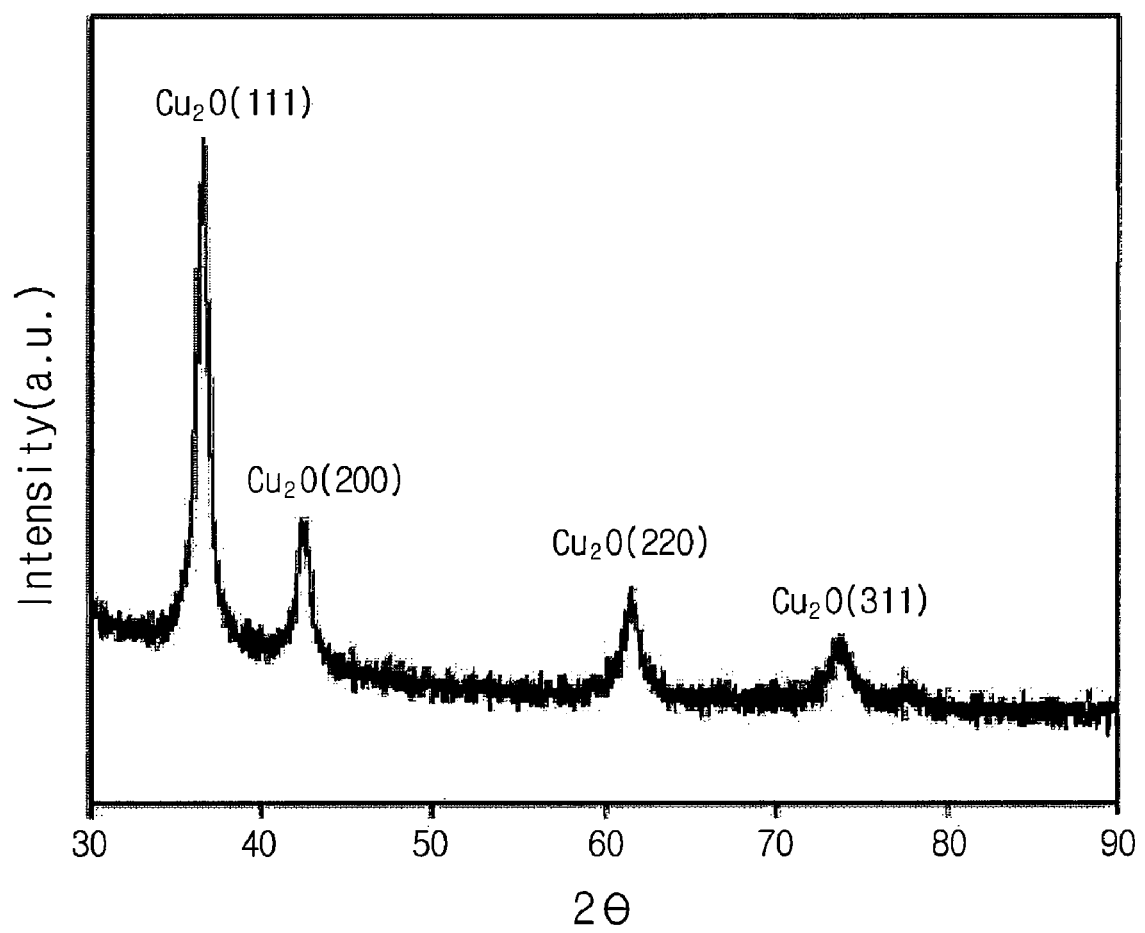
FIG. 6 is a XRD graph of copper oxide nanoparticles manufactured in example 1 of the invention.
Figure 7:
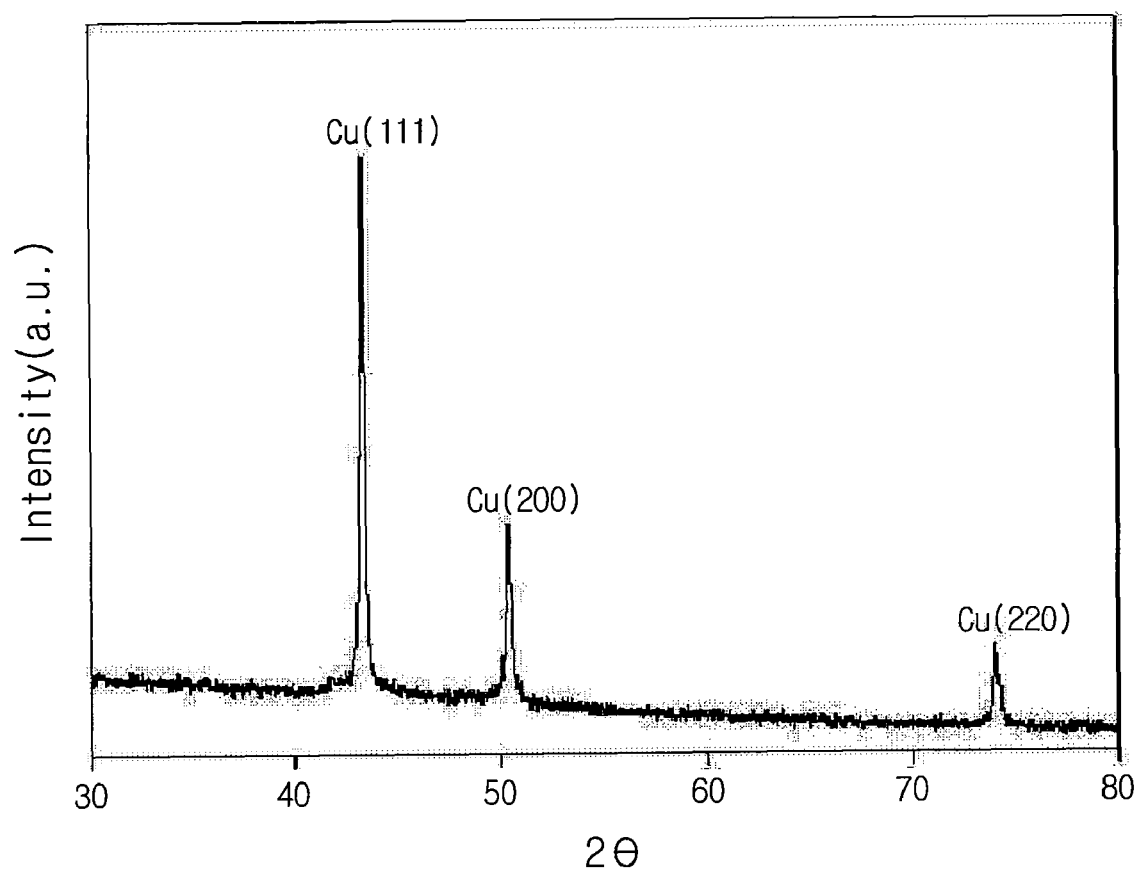
FIG. 7 is a XRD graph of copper nanoparticles manufactured in example 3 of the invention.

FIG. 6 is a XRD graph of the copper oxide nanoparticles manufactured in example 1, and FIG. 7 is a XRD graph of the copper nanoparticles manufactured in example 3.

As shown in the examples, according to the condition of manufacturing, copper nanoparticles with a cubic shape can be manufactured in metal oxide state or metal state.

If the cubic copper nanoparticles manufactured according to the invention are used in manufacturing a conductive nano-ink and the nano-ink is ejected via inkjet, it is advantageous that void between particles can be reduced, conductivity of a conductive wiring can be improved, and the height of a wiring can be higher in topology than in the case of using sphere metal nanoparticles.

It is also apparent that the present invention is not limited to the examples set forth above and more changes may be made by those skilled in the art without departing from the principles and spirit of the present invention.

What is claimed is:

1. A method for manufacturing cubic copper nanoparticles, the method comprising:
    mixing and agitating a copper precursor and an amine compound adding a reducing agent to the mixed solution;
    raising a temperature of the mixed solution to a temperature within the range of 90-170° C. and reacting the mixed solution at the same temperature adding the mixture to a nonaqueous solvent to lower the temperature of the solution to 20-50° C. when the incubation completes; and precipitating and obtaining the nanoparticles by adding an alcohol solvent to the mixture.

2. The method of claim 1, wherein the copper precursor is one or more compounds selected from the group consisting of copper(II) chloride, copper(II) nitrate, copper(II) sulfate, copper(II) acetate, copper(II) acetylacetonate, copper(II) carbonate, copper(II) cyclohexane butyrate, copper(II) stearate, copper(II) perchlorate, copper(II) ethylenediamine and copper(II) hydroxide.

3. The method of claim 1, wherein the amine compound is a primary amine of C3-C20.

4. The method of claim 1, wherein the amine compound is one or more compounds selected from the group consisting of oleylamine, decylamine, isodecylamine, dodecylamine, tetradecylamine, octadecylamine and butylamine.

5. The method of claim 1, wherein the content of the amine compound is 650-850 parts by weight with respect to 100 parts by weight of the copper precursor.

6. The method of claim 1, wherein the temperature of the mixed solution is raised in a uniform rate.

7. The method of claim 6, wherein the temperature is raised in 1-10° C./minute of a rate.

8. The method of claim 1, wherein the reaction of the mixed solution is conducted for 1-30 minutes.

9. The method of claim 1, wherein the reducing agent is one or more compounds selected from the group consisting of sodium hydroxide, potassium hydroxide, hydrazine, sodium hydrophosphate, glucose, ascorbic acid, tannic acid, dimethyl formamide, tetrabutyl ammonium borohydride, sodium borohydride, lithium borohydride and formic acid.

10. The method of claim 1, wherein the content of the reducing agent is 0.001-30 parts by weight with respect to 100 parts by weight of the mixed solution.

11. The method of claim 1, wherein the nonaqueous solvent is one or more compounds selected from the group consisting of benzene, fluorobenzene, toluene, trifluorotoluene, xylene, hexane, cyclohexane, heptane, octane, isooctane, decane, tetradecane, 1-octadecene, 1-hexadecene and tetrahydrofuran.

12. The method of claim 1, wherein the nonaqueous solvent is used after chilled.

13. The method of claim 1, wherein the alcohol solvent is one or more compounds selected from the group consisting of methanol, ethanol, propanol and isopropanol.

14. The method of claim 1, wherein the alcohol solvent is a mixed solution of methanol and ethanol.

15. The method of claim 1, wherein obtaining nanoparticles is performed by isolating nanoparticles from the mixed solution by centrifugation.

16. The method of claim 1, wherein obtaining nanoparticles comprises washing with alcohol solvent and drying.

17. The method of claim 1, the metal nanoparticles obtained are in a metal state or a metal oxide state.

* * * * *